(12) United States Patent
Liang et al.

(10) Patent No.: US 8,557,677 B2
(45) Date of Patent: Oct. 15, 2013

(54) STACK-TYPE SEMICONDUCTOR DEVICE AND METHOD FOR MANUFACTURING THE SAME

(75) Inventors: Qingqing Liang, Beijing (CN); Huicai Zhong, Beijing (CN); Chao Zhao, Kessel-Lo (BE); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 166 days.

(21) Appl. No.: 13/120,792

(22) PCT Filed: Feb. 17, 2011

(86) PCT No.: PCT/CN2011/071057
§ 371 (c)(1),
(2), (4) Date: Mar. 24, 2011

(87) PCT Pub. No.: WO2012/062060
PCT Pub. Date: May 18, 2012

(65) Prior Publication Data
US 2012/0112358 A1    May 10, 2012

(30) Foreign Application Priority Data
Nov. 10, 2010 (CN) .......................... 2010 1 0540727

(51) Int. Cl.
*H01L 21/30* (2006.01)
(52) U.S. Cl.
USPC .................................. 438/455; 257/E23.174
(58) Field of Classification Search
USPC ........................ 438/455–459, 464; 257/E23.169–E23.174
See application file for complete search history.

(56) References Cited

U.S. PATENT DOCUMENTS

| 6,821,826 B1* | 11/2004 | Chan et al. ............. 438/150 |
| 7,842,548 B2* | 11/2010 | Lee et al. .............. 438/108 |
| 7,943,482 B2* | 5/2011 | Aitken et al. .......... 438/425 |
| 2008/0233710 A1* | 9/2008 | Hsu et al. .............. 438/455 |

(Continued)

FOREIGN PATENT DOCUMENTS

| CN | 101197297 A | 6/2008 |
| CN | 101834152 A | 9/2010 |
| WO | 2010/116694 A2 | 10/2010 |

OTHER PUBLICATIONS

International Search Report and Written Opinion issued Sep. 1, 2011, in related Chinese Application No. PCT/CN2011/071057 (no translation) (10 pages).

*Primary Examiner* — Matthew W Such
*Assistant Examiner* — Ali Naraghi
(74) *Attorney, Agent, or Firm* — Osha Liang LLP

(57) ABSTRACT

A stack-type semiconductor device includes a semiconductor substrate; and a plurality of wafer assemblies arranged in various levels on the semiconductor substrate, in which the wafer assembly in each level includes an active part and an interconnect part, and the active part and the interconnect part each have conductive through vias, wherein the conductive through vias in the active part are aligned with the conductive through vias in the interconnect part in a vertical direction, so that the active part in each level is electrically coupled with the active part in the previous level and/or the active part in the next level by the conductive through vias. Such a stack-type semiconductor device and the related methods can be applied in a process after the FEOL or in a semiconductor chip packaging process and provide a 3-dimensional semiconductor device of high integration and high reliability.

4 Claims, 5 Drawing Sheets

(56) References Cited

U.S. PATENT DOCUMENTS

2008/0274592 A1* 11/2008 Lee et al. .................. 438/113
2010/0032795 A1 2/2010 Aitken et al.
2010/0182041 A1* 7/2010 Feng et al. ................. 326/38
2010/0264551 A1* 10/2010 Farooq et al. .............. 257/777
2011/0248396 A1* 10/2011 Liu et al. ................... 257/686
2012/0034759 A1* 2/2012 Sakaguchi et al. .......... 438/458

* cited by examiner

STACK-TYPE SEMICONDUCTOR DEVICE AND METHOD FOR MANUFACTURING THE SAME

FIELD OF INVENTION

The present invention relates to a semiconductor device and a method for manufacturing the same, in particular, to a stack-type semiconductor device provided with through wafer vias (referred as TWV) and a method for interconnecting the semiconductor devices at different levels with the TWV.

DESCRIPTION OF PRIOR ART

One important trend in the development of semiconductor devices is to reduce the footprint of semiconductor devices on a wafer. A 3-dimensional integration of semiconductor devices, in which the semiconductor devices are stacked at various levels in a direction perpendicular to the surface of the wafer, will multiply the integration level and promote miniaturization and performance improvement of the semiconductor devices.

Stacked wafers are typically electrically and physically coupled with each other by through vias which are formed directly on the wafers in respective levels. The process of forming the through vias comprises firstly forming a through hole in a silicon wafer by etching and back-side grinding, then forming an insulating layer on sidewalls of the through hole by thermal oxidation, and finally filling the through hole with a metal. After the through vias formation, the wafer having active devices and through vias formed therein is temporarily transferred to a carrier tape so that it can be bonded with wafers at other levels.

In order to form the through vias, the wafer at each level should have a restricted thickness. If the thickness of the wafer is too small, the wafer will have a poor mechanical strength and possibly break when being transferred to the carrier tape. If the thickness of the wafer is too large, the through hole will have a large aspect ratio and be difficult to form by etching due to an incomplete etching, which in turn leads to an open-circuit failure of the interconnect in the resultant semiconductor devices.

Thus, the semiconductor devices in the above conventional 3-dimensional integration configuration still have problems of poor reliability, low yield, and performance deterioration due to stress concentration near the through vias.

SUMMARY OF THE INVENTION

One object of the present invention is to provide an improved stack-type semiconductor device and a method for manufacturing the same, which reduce the design limitation on the stack-type semiconductor device caused by the through vias and mitigate disadvantageous impacts on the performance of the stacked semiconductor device by the through vias.

According to one aspect of the present invention, there provides stack-type semiconductor device, comprising a semiconductor substrate; and a plurality of wafer assemblies arranged in various levels on the semiconductor substrate, wherein the wafer assembly in each level comprises an active part and an interconnect part, and the active part and the interconnect part each have conductive through vias, wherein the conductive through vias in the active part are aligned with the conductive through vias in the interconnect part in a vertical direction, so that the active part in each level is electrically coupled with the active part in the previous level and/or the active part in the next level by the conductive through vias.

According to another aspect of the invention, there provides a method for manufacturing a stack-type semiconductor device, comprising the steps of:

a) providing wafer assemblies each having an interconnect wafer and an active wafer, wherein the interconnect wafer comprises a glass substrate and an interconnect part on the glass substrate, the interconnect part having conductive through vias therein, and the active wafer comprises a semiconductor substrate and an active part on the semiconductor substrate, the active part having conductive through vias therein;

b) removing the glass substrate in a first wafer assembly;

c) removing the semiconductor substrate in a second wafer assembly;

d) bonding the first wafer assembly and the second wafer assembly together by a direct wafer bonding process so that the conductive through vias in the active part of the first wafer assembly are electrically coupled with the conductive through vias in the interconnect part of the second wafer assembly;

e) removing the glass substrate in the second wafer assembly;

f) repeating the steps c)-e) so that a plurality of levels of wafer assemblies are stacked.

According to yet another aspect of the invention, there provides a method for manufacturing a stack-type semiconductor device, comprising the steps of:

a) providing wafer assemblies each having an interconnect wafer and an active wafer, wherein the interconnect wafer comprises a glass substrate and an interconnect part on the glass substrate, the interconnect part having conductive through vias therein, and the active wafer comprises a semiconductor substrate and an active part on the semiconductor substrate, the active part having conductive through vias therein;

c) removing the semiconductor substrate in a first wafer assembly;

c) removing the glass substrate in a second wafer assembly;

d) bonding the first wafer assembly and the second wafer assembly together by a direct wafer bonding process so that the conductive through vias in the active part of the first wafer assembly are electrically coupled with the conductive through vias in the interconnect part of the second wafer assembly;

e) removing the semiconductor substrate in the second wafer assembly;

f) repeating the steps c)-e) so that a plurality of levels of wafer assemblies are stacked;

f) repeating the steps c)-d) so that a lowermost wafer assembly is stacked;

h) removing the glass substrate in an uppermost wafer assembly.

Because the wafer assembly comprises an interconnect wafer and an active wafer bonded together, the active part can have a reduced thickness. Thus, conductive through vias can be easily formed in the active part, which lowers the manufacturing cost of the semiconductor device.

Moreover, during the direct wafer bonding, the interconnect part supports and protects the active part of the active wafer, which can increase the manufacturing yield and the reliability of the semiconductor devices. Furthermore, the manufacturing cost of the semiconductor device can be further lowered by using a standardized interconnect wafer.

DETAILED DESCRIPTION OF PREFERRED EMBODIMENTS

Figure 1:
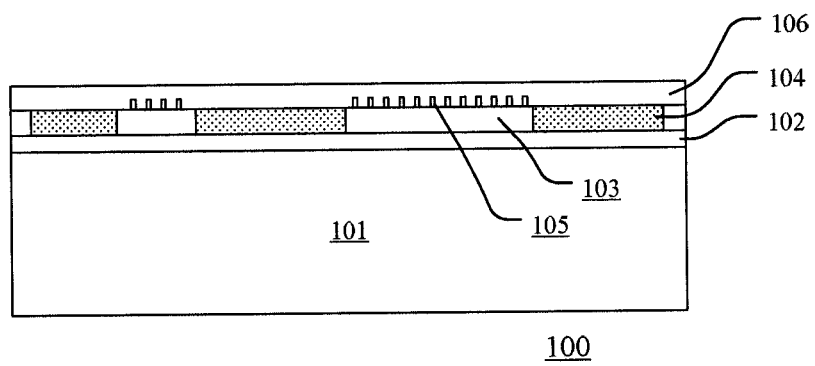
FIGS. 1 to 3 show cross sectional views of the semiconductor structure at various stages of the method for manufacturing the stack-type semiconductor device according to the present invention.

Exemplary embodiments of the present invention are described in more details below with reference to the accompanying drawings. In the drawings, like reference numerals denote like members. The figures are not drawn to scale, for the sake of clarity.

It is understood that when one layer or region is referred to as being "above" or "on" another layer or region in the description of a semiconductor device structure, it can be directly above or on the other layer or region, or other layers or regions may be intervened therebetween. Moreover, if the device in the figures is turned over, the layer or region will be "under" or "below" the other layer or region.

In contrast, when one layer is referred to as being "directly on" or "on and adjacent to" another layer or region, there are not intervening layers or regions present.

In the present application, the term "semiconductor structure" means generally the whole semiconductor structure formed at each step of the method for manufacturing the semiconductor device, including all of the layers and regions having been formed.

Some particular details of the invention will be described below, such as an exemplary semiconductor structure, material, dimension, process step and fabricating method of the device, for a better understanding of the present invention. Nevertheless, it is understood by one skilled person in the art that these details are not always essential for but can be varied in a specific implementation of the invention.

Unless the context clearly indicates otherwise, each part of the semiconductor device can be made of material(s) well known to one skilled person in the art.

Although the following exemplary steps are illustrated as being applied to Back-End-Of-Line of the semiconductor process, in which the through-wafer vias are formed together with interconnects and wirings to connect the wafers at various levels, it would be apparent that similar steps can be applied to a packaging process of semiconductor chips, in which the through-chip vias are formed to connect the chips at various levels.

According to a preferred embodiment of the inventive method, the steps shown in FIGS. 1 to 6 are performed in order for manufacturing the stack-type semiconductor device.

As shown in FIG. 1, an exemplary method according to the present invention starts from a conventional semiconductor structure which has already been subjected to Front-End-Of-Line processes in a CMOS (complementary metal-oxide-semiconductor) process.

The active wafer 100 comprising a semiconductor substrate 101, a first insulating layer 102 on the semiconductor substrate 101, a plurality of active regions 103 on the first insulating layer 102, a second insulating layer 104 for isolating the active regions 103, and a third insulating layer 106 covering the plurality of active regions 103 and the second insulating layer 104. A plurality of transistors may be provided in each active region 103. It should be noted that only the gates 105 of the transistors are shown in FIG. 1. At both sides of each gate, doped regions have been formed by ion implantation in the FEOL process for providing source/drain regions (not shown).

The first insulating layer 102 and the third insulating layer 106 may be formed of the material for a conventional inter-layer dielectric (IDL), and the second insulating layer 104 may be formed of the material for a conventional shallow trench isolation (STI). As will be discussed hereinafter, the first insulating layer 102 and the third insulating layer 106 should be suitable for direct bonding process.

Preferably, a portion of the gates 105 may be dummy gates which do not form complete active devices, so as to provide a pattern of uniform density.

Figure 5:
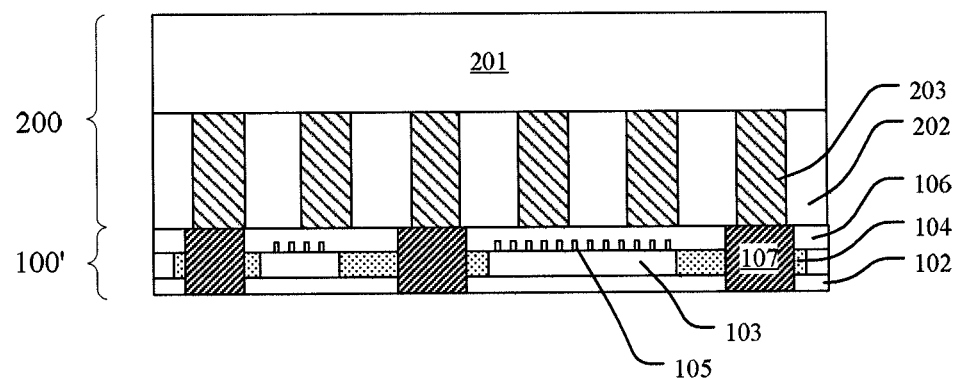

More preferably, the dummy gates may be provided either in the active regions 103 or on the second insulating layer 104, in view of the design requirement (see FIG. 5).

A plurality of conductive through vias 107 are formed in the active wafer 100 in the following steps.

Firstly, a patterned photoresist mask (not shown) is provided on the surface of the semiconductor structure shown in FIG. 1.

The exposed portions of the first insulating layer 102, the second insulating layer 104, and the third insulating layer 106 are then removed by a dry etching process, such as ion beam milling, plasma etching, reactive ion etching, and laser ablation, or by a wet etching process in which a solution of etchant is used. The etching stops at the top surface of the semiconductor substrate 101 and provides holes extending through the first insulating layer 102, the second insulating layer 104, and the third insulating layer 106.

Then, the photoresist mask (not shown) is removed by ashing or dissolution with a solvent.

A metal, such as Cu, W, or the like, is then deposited to fill the holes by a conventional deposition process, such as PVD, CVD, atomic layer deposition, sputtering, and the like.

Figure 2:
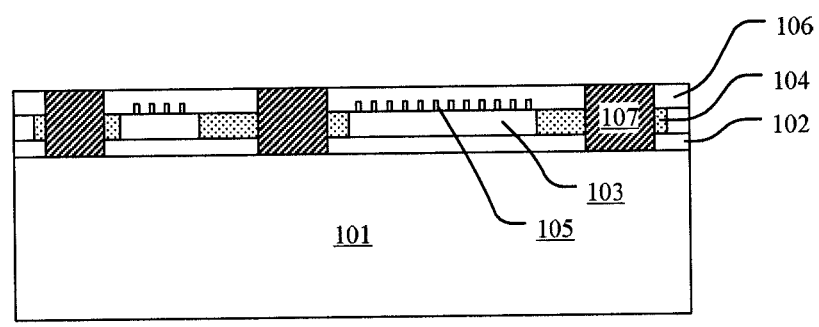

The surface of the semiconductor structure is then planarized by chemical mechanical planarization (CMP), which removes the metal around the vias, and provides the conductive through vias 107 extending through the first insulating layer 102, the second insulating layer 104, and the third insulating layer 106, as shown in FIG. 2.

Alternatively, the conductive through vias 107 can also be formed in the active regions 103. That is, the conductive through vias 107 may extend through the active layer. To do so, after forming the holes, an additional oxidation step is performed so as to form an insulating layer on inner walls of the holes, so that the conductive through vias 107 can be isolated from other elements in the active regions 103.

Typically, a sum of the thicknesses of the first insulating layer 102, the second insulating layer 104, and the third insulating layer 106 is about 0.1 um~1 um.

Figure 3:
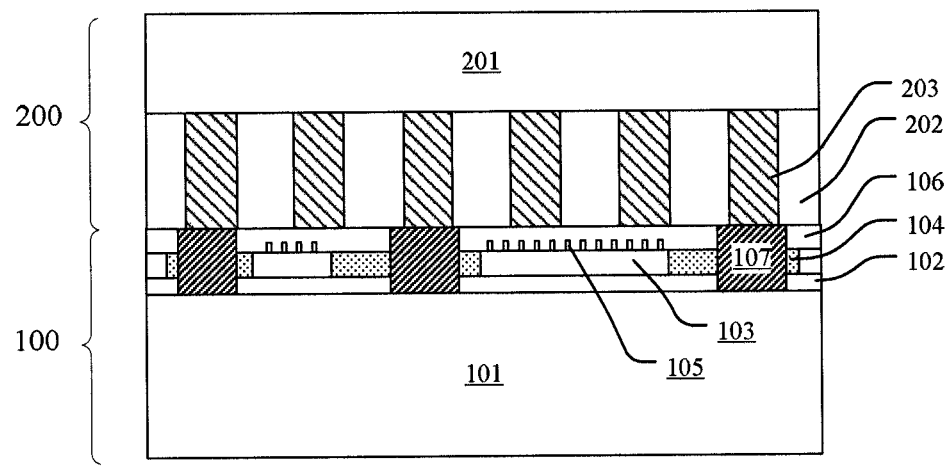

As shown in FIG. 3, the active wafer 100 is then bonded with an interconnect wafer 200 by a direct wafer bonding process. As an example, the direct wafer bonding process is performed at a temperature below 200□. During the wafer bonding process, the conductive through vias 107 in the active wafer 100 are connected to conductive through vias 203 in the interconnect wafer.

The interconnect wafer 200 comprises a glass substrate 201, a fourth insulating layer 202 formed on the glass substrate 201, and conductive through vias 203 formed in the fourth insulating layer 202. The conductive through vias 203 extend through the fourth insulating layer 202. The fourth insulating layer 202 may comprise any insulating dielectric films, such as polymer and the like, and the conductive through vias 203 may comprise any conductors, such as metals, carbon nanotubes, and the like.

The fourth insulating layer 202 has a thickness in the range of 10 um~100 um, so that the interconnect wafer 200 can provide a mechanical strength for supporting the active wafer 100 during the subsequent thinning and transfer processes.

Preferably, the fourth insulating layer 202 may be formed on the glass substrate 201 by any of the above mentioned conventional deposition processes, and the conductive through vias 203 may be formed in the fourth insulating layer 202 with the process similar to that for forming the conductive through vias 107.

In the final semiconductor device, the fourth insulating layer 202 will be bonded with the first insulating layer 102 and the third insulating layer 106, respectively. Thus, all of the first insulating layer 102, the third insulating layer 104, and the fourth insulating layer 202 are made of material suitable for a direct wafer bonding process, such as silicon oxide or silicon nitride.

The conductive through vias 107 in the active wafer 100 are aligned in the vertical direction with the conductive through vias 203 in the bonding wafer 200.

Preferably, the conductive through vias 203 in the interconnect wafer 200 are arranged in a grid array in which a pitch between two adjacent conductive through vias 203 is denoted as d. A pitch between two adjacent conductive through vias 107 in the active wafer 100 is denoted as D, which satisfies the relation D=n*d, where n is an integer. The conductive through vias 107 in the active wafer 100 may not be distributed uniformly, as shown in FIG. 3. That is, the pitch D between two adjacent conductive through vias 107 in one direction may be different form that between two adjacent conductive through vias 107 in another direction. Moreover, the pitch D between two adjacent conductive through vias 107 may be varied at different locations in one direction.

Preferably, a standard interconnect wafer 200, which has a constant pitch d of the conductive through vias, may be used for different active wafers 100. Although it might limit the design freedom of the conductive through vias 107 in the active wafer 100, the use of a standard interconnect wafer 200 can significantly lower the manufacturing cost of the semiconductor device.

Thus, a wafer assembly comprising an active wafer 100 and an interconnect wafer 200 which are bonded together are provided according to the steps shown in FIGS. 1 to 3.

(First Embodiment)

According to a first embodiment of the present invention, wafer assemblies are stacked from bottom to top.

Firstly, a wafer assembly comprising an active wafer 100 and an interconnect wafer 200 which are bonded together is provided according to the steps shown in FIGS. 1 to 3.

Figure 4:
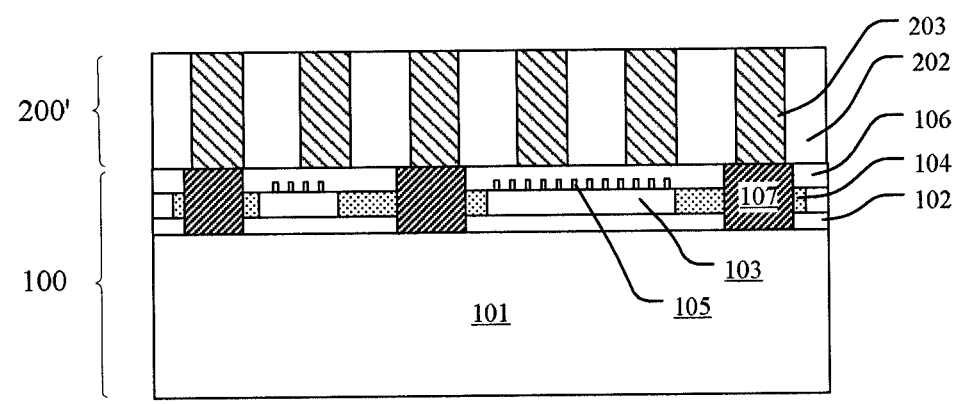
FIGS. 4 to 6 show cross sectional views of the semiconductor structure at various stages of the method for manufacturing the stack-type semiconductor device according to the first embodiment of the present invention.

Then, the glass substrate 201 of the interconnect wafer 200 in the wafer assembly is completely removed by CMP, so that one ends of the conductive through vias 203 are exposed at the surface of the interconnect wafer 200 that is opposite to the active wafer 100, as shown in FIG. 4. In the present application, the interconnect wafer with the glass substrate removed is referred to as "interconnect part" and denoted as 200'. In this step, the semiconductor substrate 101 in the active wafer 100, and the interconnect part 200' together provide a mechanical strength sufficient for the CMP so that the active regions 103 in the active wafer 100 are not damaged.

Thereby, a lowermost wafer assembly having a semiconductor substrate 101 which will be used as the semiconductor substrate of the final semiconductor device 10 is provided.

Then, another wafer assembly comprising an active wafer 100 and an interconnect wafer 200 which are bonded together is provided according to the steps shown in FIGS. 1 to 3.

Next, the semiconductor substrate 101 of the active wafer 100 in the wafer assembly is completely removed by CMP, so that one ends of the conductive through vias 107 are exposed at the surface of the active wafer 100 that is opposite to the interconnect wafer 200, as shown in FIG. 5. In the present application, the active wafer with the semiconductor substrate removed is referred to as "active part" and denoted as 100'. In this step, the interconnect wafer 200 provides a mechanical strength sufficient for the CMP so that the active regions 103 in the active wafer 100' are not damaged.

Then, a carrier tape (not shown) is then adhered to the glass substrate 201 of the semiconductor structure shown in FIG. 5 so that the semiconductor structure is transferred to the carrier tape.

Subsequently, the wafer assembly in an upper level shown in FIG. 5 is then bonded with the wafer assembly in a lower level shown in FIG. 4 by a direct wafer bonding process.

Then, the glass substrate 201 in the upper level of wafer assembly is completely removed, for example, by CMP, so that one ends of the conductive through vias 203 are exposed at the surface of the interconnect wafer 200 that is opposite to the active part 100' to form an interconnect part 200' in the upper level.

In this bonding step, the active part 100' of the wafer assembly in the upper level is bonded with the interconnect part 200' of the wafer assembly in the lower level, and is therefore coupled with the active part 100' of the wafer assembly in the lower level by the conductive through vias 203.

Figure 6:
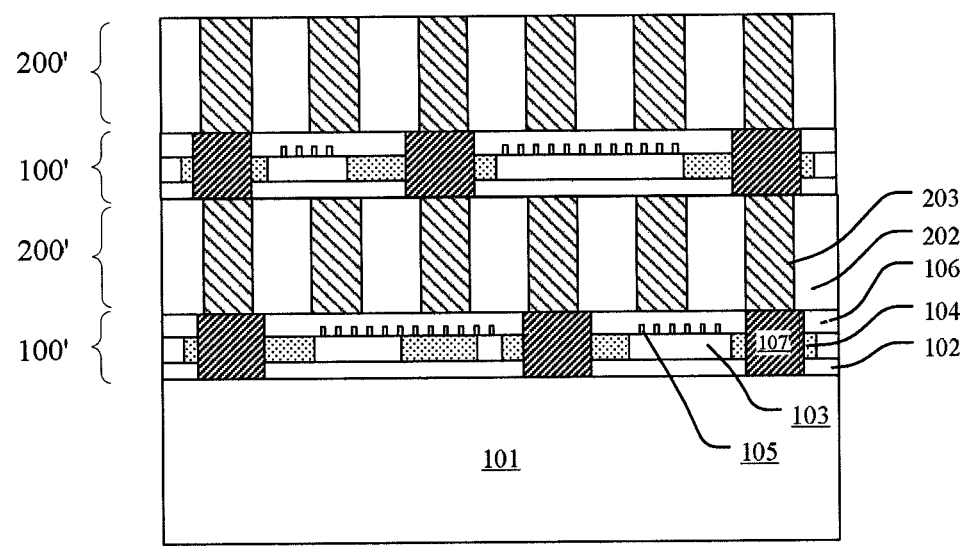

Thereby, a wafer assembly of an upper level is stacked on the lowermost wafer assembly, as shown in FIG. 6.

Then, the steps shown in FIGS. 5 and 6 are repeated, so as to stack more wafer assemblies of upper levels on the lowermost wafer assembly.

(Second Embodiment)

According to the second embodiment of the present invention, wafer assemblies are stacked from top to bottom.

Firstly, a wafer assembly comprising an active wafer 100 and an interconnect wafer 200 which are bonded together is provided according to the steps shown in FIGS. 1 to 3.

Figure 7:
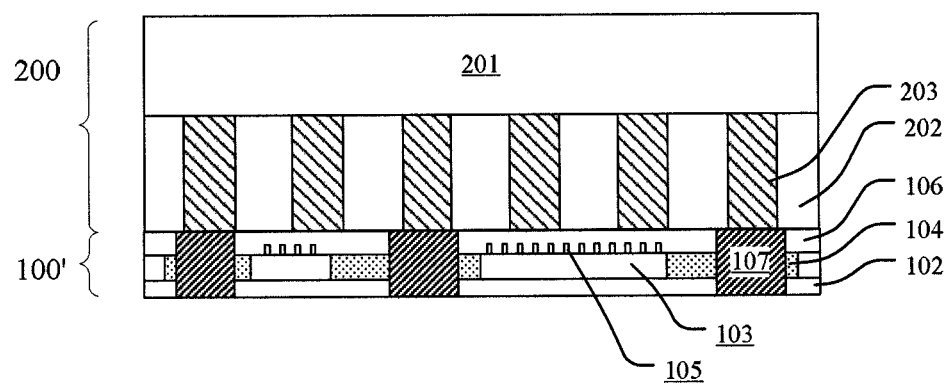
FIGS. 7 to 9 show cross sectional views of the semiconductor structure at various stages of the method for manufacturing the stack-type semiconductor device according to the second embodiment of the present invention.

The semiconductor substrate 101 of the active wafer 100 in the wafer assembly is then completely removed by CMP, so that one ends of the conductive through vias 107 are exposed at the surface of the active wafer 100 that is opposite to the interconnect wafer 200, as shown in FIG. 7. In this step, the interconnect wafer 200 provides a mechanical strength sufficient for the CMP so that the active regions 103 in the active wafer 100' are not damaged.

Figure 10:
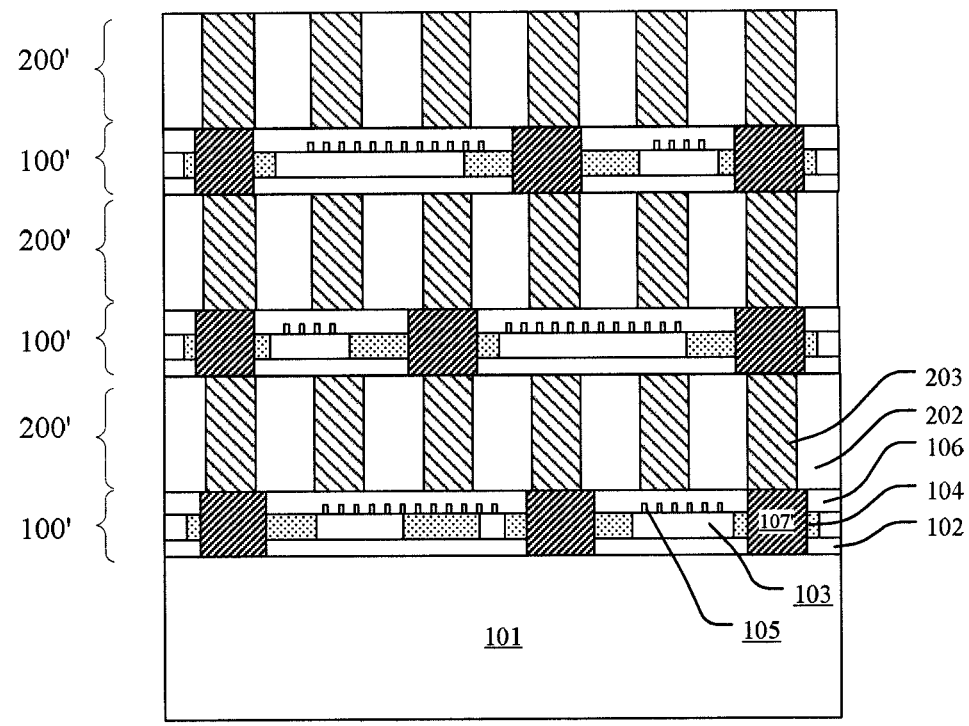
FIG. 10 shows a cross sectional view of the stack-type semiconductor device according to the present invention.

Thereby, an upmost wafer assembly having a glass substrate 201 at the top which will be removed in the final semiconductor device 10, as shown in FIG. 10 is provided.

Then, another wafer assembly comprising an active wafer 100 and an interconnect wafer 200 which are bonded together is provided according to the steps shown in FIGS. 1 to 3.

Figure 8:
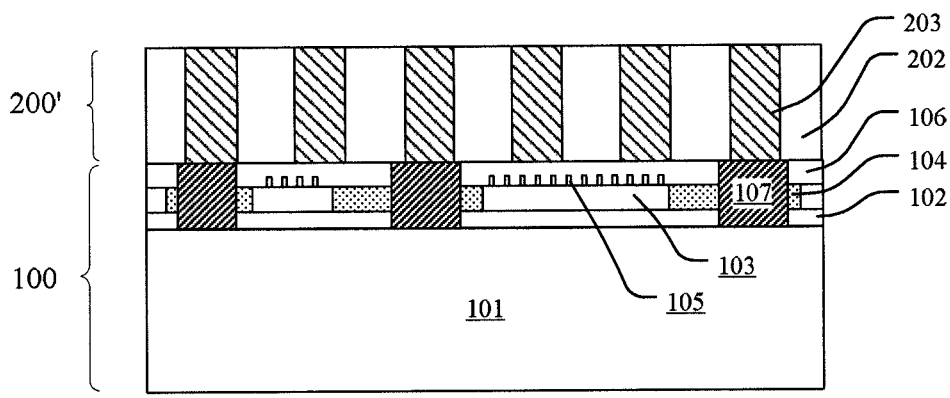

Next, the glass substrate 201 of the interconnect wafer 200 in the wafer assembly is completely removed by CMP, so that one ends of the conductive through vias 203 are exposed at the surface of the interconnect wafer 200 that is opposite to the active wafer 100, as shown in FIG. 8. In this step, the semiconductor substrate 101 in the active wafer 100 and the interconnect part 200' together provide a mechanical strength sufficient for the CMP so that the active regions 103 in the active wafer are not damaged.

Then, a carrier tape (not shown) is then adhered to the glass substrate 201 of the semiconductor structure shown in FIG. 7 so that the semiconductor structure is transferred to the carrier tape.

Subsequently, the wafer assembly of an upper level shown in FIG. 7 is then bonded with the wafer assembly of a lower level shown in FIG. 8 by a direct wafer bonding process.

Then, the semiconductor substrate 101 of the active wafer 100 in the wafer assembly of the lower level is completely removed by CMP, so that one ends of the conductive through vias 107 are exposed at the surface of the active wafer 100 that is opposite to the interconnect wafer 200.

Figure 9:
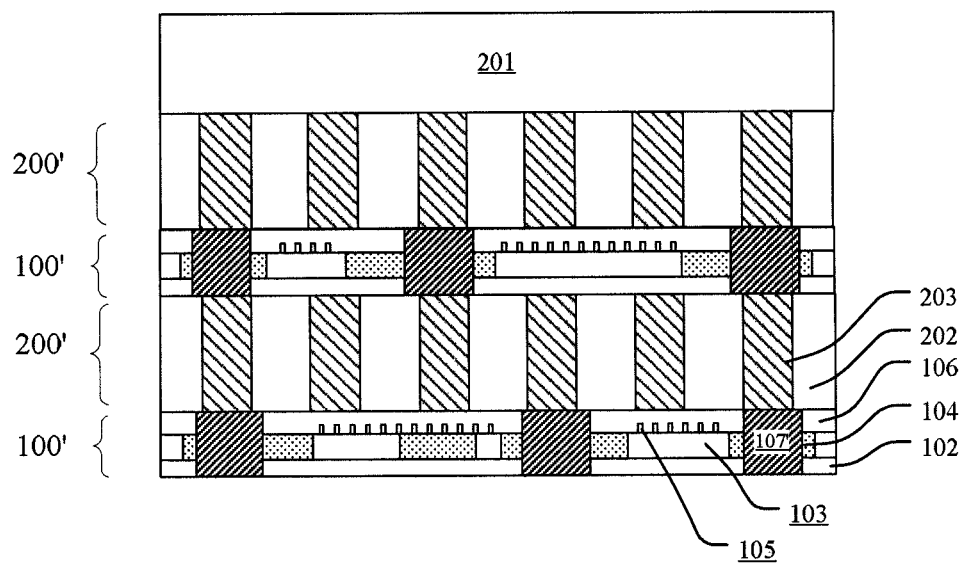

Thereby, a wafer assembly of a lower level of is stacked on the upmost wafer assembly, as shown in FIG. 9.

In this bonding step, the active part 100' of the wafer assembly in the upper level is bonded with the interconnect part 200' of the wafer assembly in the lower level, and is therefore coupled with the active part 100' of the wafer assembly in the lower level by the conductive through vias 203.

Then, the steps shown in FIGS. 8 and 9 are repeated, so as to stack more wafer assemblies of lower levels beneath the upmost wafer assembly.

Finally, a lowermost wafer assembly is stacked. The semiconductor substrate 101 of the active wafer 100 in the lowermost wafer assembly remains, and the glass substrate 201 of the interconnect wafer 200 in the uppermost wafer assembly is completely removed by CMP.

With the stack schemes according to the first and second embodiments, stack-type semiconductor devices 10 having the same configuration are formed, as shown in FIG. 10. The semiconductor device 10 comprises a semiconductor substrate 101 and a plurality of wafer assemblies arranged in various levels on the semiconductor substrate 101. The wafer assembly in each level comprises an active part 100' and an interconnect part 100', and the conductive through vias 107 of the active part 100' and the conductive through vias 203 of the interconnect part 200' are aligned to each other. The active part 100' in each level is electrically coupled with the active part 100' in the previous level and/or the active part in the next level by the conductive through vias 107, 203.

In such a semiconductor device 10, even if it has a small thickness, the active part 100' will not break when being subjected to a CMP or a transfer process shown in FIGS. 4 and 5 due to the support by the interconnect part 200'. Moreover, the conductive through vias 107 can have a significantly lower aspect ratio because an active part 100' having a smaller thickness can be used, which facilitates a complete etching and save the etching time.

While the invention has been described with reference to specific embodiments, the description is illustrative of the invention. The description is not to be considered as limiting the invention. Various modifications and applications may occur for those skilled in the art without departing from the true spirit and scope of the invention as defined by the appended claims.

What is claimed is:

1. A method for manufacturing a stack-type semiconductor device, comprising the steps of:
   a) providing wafer assemblies each having an interconnect wafer and an active wafer, wherein the interconnect wafer comprises a glass substrate and an interconnect part on the glass substrate, the interconnect part having conductive through vias therein, and the active wafer comprises a semiconductor substrate and an active part on the semiconductor substrate, the active part having conductive through vias therein;
   b) removing the glass substrate in a first wafer assembly to form a first surface;
   c) removing the semiconductor substrate in a second wafer assembly to form a second surface;
   d) bonding the first wafer assembly and the second wafer assembly together by a direct wafer bonding process with the first surface and the second surface contacting each other so that the conductive through vias in the active part of the first wafer assembly are in direct electrical contact with the conductive through vias in the interconnect part of the second wafer assembly;
   e) removing the glass substrate in the second wafer assembly;
   f) repeating the steps c)-e) so that a plurality of levels of wafer assemblies are stacked.

2. The method according to claim 1, wherein the step a) comprises:
   bonding the interconnect wafer and the active wafer together by a direct wafer bonding process so that the conductive through vias in the active part are electrically coupled with the conductive through vias in the interconnect part.

3. A method for manufacturing a stack-type semiconductor device, comprising the steps of:
   a) providing wafer assemblies each having an interconnect wafer and an active wafer, wherein the interconnect wafer comprises a glass substrate and an interconnect part on the glass substrate, the interconnect part having conductive through vias therein, and the active wafer comprises a semiconductor substrate and an active part on the semiconductor substrate, the active part having conductive through vias therein;
   b) removing the semiconductor substrate in a first wafer assembly to form a first surface;
   c) removing the glass substrate in a second wafer assembly to form a second surface;
   d) bonding the first wafer assembly and the second wafer assembly together by a direct wafer bonding process with the first surface and the second surface contacting each other so that the conductive through vias in the active part of the first wafer assembly are in direct electrical contact with the conductive through vias in the interconnect part of the second wafer assembly;
   e) removing the semiconductor substrate in the second wafer assembly;
   f) repeating the steps c)-e) so that a plurality of levels of wafer assemblies are stacked;
   g) repeating the steps c)-d) so that a lowermost wafer assembly is stacked;
   h) removing the glass substrate in an uppermost wafer assembly.

4. The method according to claim 3, wherein the step a) comprises
   bonding the interconnect wafer and the active wafer together by a direct wafer bonding process so that the conductive through vias in the active part are electrically coupled with the conductive through vias in the interconnect part.

* * * * *